United States Patent
Pu et al.

(10) Patent No.: US 11,805,686 B2
(45) Date of Patent: Oct. 31, 2023

(54) DISPLAY PANEL AND DISPLAY DEVICE

(71) Applicant: BOE TECHNOLOGY GROUP CO., LTD., Beijing (CN)

(72) Inventors: Chao Pu, Beijing (CN); Shengji Yang, Beijing (CN); Kuanta Huang, Beijing (CN); Pengcheng Lu, Beijing (CN); Xiaochuan Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 513 days.

(21) Appl. No.: 17/260,257

(22) PCT Filed: Mar. 27, 2020

(86) PCT No.: PCT/CN2020/081862
§ 371 (c)(1),
(2) Date: Jan. 14, 2021

(87) PCT Pub. No.: WO2021/189488
PCT Pub. Date: Sep. 30, 2021

(65) Prior Publication Data
US 2022/0140053 A1    May 5, 2022

(51) Int. Cl.
*H10K 59/131*    (2023.01)
*H10K 77/10*    (2023.01)

(52) U.S. Cl.
CPC ........... *H10K 59/131* (2023.02); *H10K 77/10* (2023.02)

(58) Field of Classification Search
CPC .............................. H10K 59/131; H10K 77/10
USPC ........................................................ 257/40
See application file for complete search history.

(56) References Cited

U.S. PATENT DOCUMENTS

| | | |
|---|---|---|
| 6,392,685 B1 | 5/2002 | Nagahata et al. |
| 6,538,336 B1 | 3/2003 | Secker et al. |
| 7,884,473 B2 | 2/2011 | Chen et al. |
| 8,680,660 B1 | 3/2014 | Law et al. |
| 9,312,242 B2 | 4/2016 | Mu et al. |

(Continued)

FOREIGN PATENT DOCUMENTS

| | | |
|---|---|---|
| CA | 2320452 A1 | 6/2000 |
| CA | 2320452 C | 6/2000 |

(Continued)

OTHER PUBLICATIONS

Written Opinion for International Application No. PCT/CN2020/081862 dated Jan. 4, 2021.

(Continued)

*Primary Examiner* — Tu-Tu V Ho
(74) *Attorney, Agent, or Firm* — Perilla Knox & Hildebrandt LLP; Kenneth A. Knox

(57) ABSTRACT

The present disclosure relates to the field of display technologies and, in particular to a display panel and a display device. The display panel includes a circuit board assembly, a plurality of sub-pixels, a base substrate, and a plurality of connecting wires. The circuit board assembly includes a plurality of first bonding pads; a plurality of second bonding pads are disposed in the non-display area of the base substrate; the plurality of connecting wires connect the plurality of first bonding pads and the plurality of second bonding pads. Adjacent connecting wires have different maximum stretchable heights in a direction perpendicular to the base substrate.

20 Claims, 3 Drawing Sheets

(56) References Cited

U.S. PATENT DOCUMENTS

| | | | |
|---|---|---|---|
| 9,985,241 B2* | 5/2018 | Koshihara | H10K 59/131 |
| 2007/0075414 A1 | 4/2007 | Tsutsumi et al. | |
| 2009/0057902 A1 | 3/2009 | Chen et al. | |
| 2010/0112761 A1 | 5/2010 | Tsutsumi et al. | |
| 2015/0061099 A1 | 3/2015 | Mu et al. | |
| 2019/0228706 A1 | 7/2019 | Umeda et al. | |

FOREIGN PATENT DOCUMENTS

| | | |
|---|---|---|
| CN | 1291138 A | 4/2001 |
| CN | 1591852 A | 3/2005 |
| CN | 100336218 C | 9/2007 |
| CN | 101131978 A | 2/2008 |
| CN | 101383333 A | 3/2009 |
| CN | 101777295 A | 7/2010 |
| CN | 102437147 A | 5/2012 |
| CN | 101777295 B | 7/2012 |
| CN | 104051400 A | 9/2014 |
| EP | 1057650 A1 | 12/2000 |
| JP | H06302638 A | 10/1994 |
| JP | H11195669 A | 7/1999 |
| JP | H11297246 A | 10/1999 |
| JP | 2000286372 A | 10/2000 |
| WO | 2012141117 A1 | 10/2012 |

OTHER PUBLICATIONS

Extended European Search Report for EP Patent Application No. 20897634.0 dated Apr. 20, 2023.

* cited by examiner

DISPLAY PANEL AND DISPLAY DEVICE

CROSS-REFERENCE TO RELATED APPLICATION

This application is a national phase application under 35 U.S.C. § 371 of International Patent Application No. PCT/CN2020/081862 filed on Mar. 27, 2020, the disclosure of which is incorporated by reference in its entirety herein.

TECHNICAL FIELD

The present disclosure relates to the field of display technologies and, in particular, to a display panel and a display device including the display panel.

BACKGROUND

At present, in a manufacturing process of a silicon-based OLED (Organic Light-Emitting Diode) display device, when filler gum is coated around, two adjacent wires are easily overlapped together due to a lateral force of flowing filler gum, leading to wire bonding short. Accordingly, yield of the silicon-based OLED display device is reduced.

SUMMARY

Embodiments of the present disclosure provide a display panel and a display device including the display panel.

In an embodiment of the present disclosure, there is provided a display panel, including:
- a base substrate having a display area and a non-display area surrounding the display area;
- a plurality of sub-pixels, located in the display area and disposed on a side of the base substrate, where at least one of the plurality of sub-pixels includes a light-emitting element and a driving circuit; the light-emitting element includes a first electrode, a light-emitting functional layer and a second electrode stacked in sequence, the first electrode is closer to the base substrate than the second electrode; the driving circuit is located between the light-emitting element and the base substrate, and includes a driving transistor, a storage capacitor, and a third electrode, and the driving transistor includes a source, a drain, and a gate; one of the source and the drain is coupled to the third electrode; the third electrode is coupled to the first electrode, and the gate is coupled to the storage capacitor;
- a circuit board assembly, located on a side of the base substrate away from the light-emitting element, and including a plurality of first bonding pads;
- a plurality of second bonding pads, located in the non-display area of the base substrate;
- a plurality of connecting wires, connecting the plurality of first bonding pads and the plurality of second bonding pads, and adjacent connecting wires among the plurality of connecting wires have different maximum stretchable heights in a direction perpendicular to the base substrate;
- the circuit board assembly is configured to provide electrical signals to the plurality of sub-pixels via the plurality of connecting wires.

In an embodiment of the present disclosure, the plurality of first bonding pads and the plurality of second bonding pads are connected in a one-to-one correspondence via two ends of the plurality of connecting wires.

In an embodiment of the present disclosure, at least one of the following are disposed in a staggered manner: the first bonding pads connected to two adjacent connecting wires among the plurality of connecting wires; or the second bonding pads connected to two adjacent connecting wires among the plurality of connecting wires.

In an embodiment of the present disclosure, the plurality of first bonding pads includes a plurality of first odd-numbered row bonding pads and a plurality of first even-numbered row bonding pads. The plurality of first odd-numbered row bonding pads are closer to an edge of the display area than the plurality of first even-numbered row bonding pads; or the plurality of first even-numbered row bonding pads are closer to the edge of the display area than the plurality of first odd-numbered row bonding pads.

In an embodiment of the present disclosure, the plurality of second bonding pads includes a plurality of second odd-numbered row bonding pads and a plurality of second even-numbered row bonding pads. The plurality of second odd-numbered row bonding pads are closer to the edge of the display area than the plurality of second even-numbered row bonding pads; or the plurality of second even-numbered row bonding pads are closer to the edge of the display area than the plurality of second odd-numbered row bonding pads.

In an embodiment of the present disclosure, the first bonding pads and the second bonding pads connected to two adjacent connecting wires among the plurality of connecting wires are both disposed in a staggered manner.

In an embodiment of the present disclosure, the plurality of first bonding pads includes the plurality of first odd-numbered row bonding pads and the plurality of first even-numbered row bonding pads, and the plurality of second bonding pads includes the plurality of second odd-numbered row bonding pads and the plurality of second even-numbered row bonding pads; the plurality of first odd-numbered row bonding pads are closer to the edge of the display area than the plurality of first even-numbered row bonding pads, and the plurality of second odd-numbered row bonding pads are closer to the edge of the display area than the plurality of second even-numbered row bonding pads; or the plurality of first odd-numbered row bonding pads are farther away from the edge of the display area than the plurality of first even-numbered row bonding pads, and the plurality of second odd-numbered row bonding pads are farther away from the edge of the display area than the plurality of second even-numbered row bonding pads.

In an embodiment of the present disclosure, the plurality of first bonding pads includes the plurality of first odd-numbered row bonding pads and the plurality of first even-numbered row bonding pads, and the plurality of second bonding pads includes the plurality of second odd-numbered row bonding pads and the plurality of second even-numbered row bonding pads; the plurality of first odd-numbered row bonding pads are closer to the edge of the display area than the plurality of first even-numbered row bonding pads, and the plurality of second odd-numbered row bonding pads are farther away from the edge of the display area than the plurality of second even-numbered row bonding pads; or the plurality of first odd-numbered row bonding pads are farther away from the edge of the display area than the plurality of first even-numbered row bonding pads, and the plurality of second odd-numbered row bonding pads are closer to the edge of the display area than the plurality of second even-numbered row bonding pads.

In an embodiment of the present disclosure, the plurality of first bonding pads are arranged in three or four rows in a staggered manner, and/or the plurality of second bonding pads are arranged in three or four rows in a staggered manner.

In an embodiment of the present disclosure, wire lengths of the plurality of connecting wires are the same.

In an embodiment of the present disclosure, the greater a distance between the first bonding pad and the second bonding pad, the shorter a length of the corresponding connecting wire connecting the first bonding pad and the second bonding pad.

In an embodiment of the present disclosure, the plurality of first bonding pads and the plurality of second bonding pads are respectively arranged in a row, and the wire lengths of two adjacent connecting wires are different.

In an embodiment of the present disclosure, the plurality of first bonding pads have a golden finger structure.

In an embodiment of the present disclosure, the base substrate is a silicon substrate.

In an embodiment of the present disclosure, the light-emitting functional layer includes:
- a hole injection layer, disposed on a side of the first electrode facing away from the base substrate;
- a hole transport layer, disposed on a side of the hole injection layer facing away from the base substrate;
- an organic light-emitting layer, disposed on a side of the hole transport layer facing away from the base substrate;
- an electron transport layer, disposed on a side of the organic light-emitting layer facing away from the base substrate;
- an electron injection layer, disposed on a side of the electron transport layer facing away from the base substrate.

In an embodiment of the present disclosure, the first electrode is an anode, and the second electrode is a cathode.

In an embodiment of the present disclosure, there is provided a display device including the above-mentioned display panel.

BRIEF DESCRIPTION OF THE DRAWINGS

The drawings that constitute a part of the specification are used for providing a further understanding of embodiments of the present disclosure, and explaining the present disclosure together with the embodiments of the present disclosure, and do not constitute a limitation to the present disclosure. The above and other features and advantages will become more apparent to those skilled in the art by describing detailed exemplary embodiments with reference to the accompanying drawings. In the accompanying drawings.

DETAILED DESCRIPTION

Figure 1:
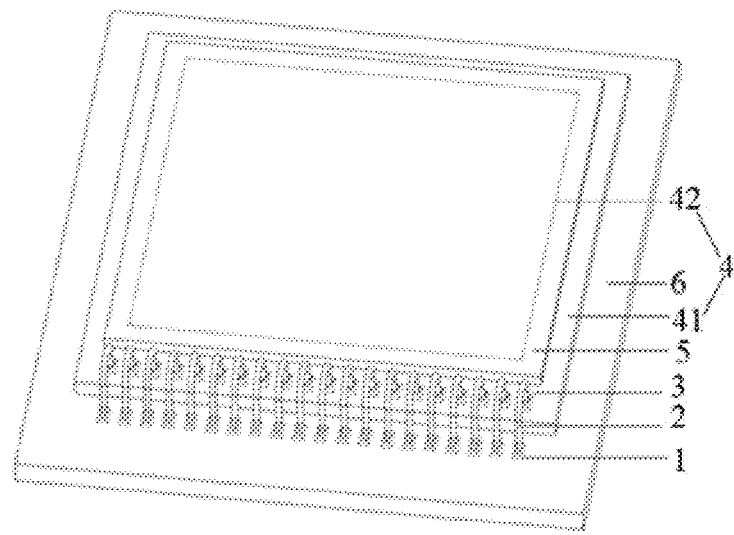
FIG. 1 is a schematic structural diagram of an exemplary implementation of a display panel in the related art.

Exemplary embodiments will now be described more fully with reference to the accompanying drawings. However, the embodiments can be implemented in a variety of forms and should not be construed as being limited to the examples set forth herein; rather, these embodiments are provided to make the present disclosure more complete so that the idea of the exemplary embodiments is fully conveyed to those skilled in this art. The same reference numerals in the drawings denote the same or similar parts, and the repeated description thereof will be omitted.

Although the relative terms such as "above" and "below" are used in the specification to describe the relative relationship of one component to another component shown, these terms are only for convenience in this specification, for example, according to an exemplary direction shown in the drawings. It will be understood that if the device shown is flipped upside down, the component described "above" will become the component "below". When a structure is "on" another structure, it may mean that a structure is integrally formed on another structure, or that a structure is "directly" disposed on another structure, or that a structure is "indirectly" disposed on another structure through other structures.

The terms "one", "a", "the", "said", and "at least one" are used to indicate that there are one or more elements/components or the like; the terms "include", "contain" and "have" are used to indicate an open meaning of including and means that there may be additional elements/components/etc. in addition to the listed elements/components/etc.

FIG. 1 is a schematic structural diagram of an exemplary implementation of a display panel in the related art, and as shown in FIG. 1, a base substrate 4 is disposed on a circuit board assembly 6, and a plurality of first bonding pads 1 are disposed on the circuit board assembly 6. The first bonding pads 1 are arranged in a line. A plurality of second bonding pads 3 are disposed in a non-display area 41 of the base substrate 4, and the second bonding pads 3 are arranged in a line. A plurality of connecting wires 2 are bent into arch shapes, and two ends of each connecting wire 2 are connected to a corresponding first bonding pad 1 and a corresponding second bonding pad 3 respectively. Heights of the arch shapes of the plurality of connecting wires 2 are the same, and the plurality of connecting wires 2 are neatly arranged. When filler gum are coated around, the connecting wire 2 may be inclined due to a lateral force of flowing filler gum, and two adjacent wires are easily overlapped together, leading to wire bonding short. As a result, yield of the silicon-based OLED display device is reduced.

The present disclosure first provides a display panel. Referring to schematic structural diagrams of exemplary embodiments of a display panel of the present disclosure shown in FIGS. 2 and 3, the display panel may include a base substrate 4, a circuit board assembly 6, a plurality of sub-pixels, a plurality of second bonding pads 3 and a plurality of connecting wires 2. The base substrate 4 includes a display area 42 and a non-display area 41 surrounding the display area 42. The plurality of sub-pixels are disposed in the display area 42 and located on one side of the base substrate 4. At least one of the sub-pixels includes a light-emitting element and a driving circuit. The light-emitting element includes a first electrode 81, a light-emitting functional layer 11 and a second electrode 82 stacked in sequence, the first electrode 81 is closer to the base substrate 4 than the second electrode 82. The driving circuit is located between the light-emitting element and the base substrate 4, and includes a driving transistor, a storage capacitor, and a third electrode 83. The driving transistor includes a source 71, a drain 72, and a gate 73. One of the source 71 and the drain 72 is coupled to the third electrode 83, the third electrode 83 is coupled to the first electrode 81, and the gate 73 is coupled to the storage capacitor. The circuit board assembly 6 is located on a side of the base substrate 4 facing away from the light-emitting element, and may include a plurality of first bonding pads 1. The plurality of second bonding pads 3 are located in the non-display area 41 of the base substrate 4. The first bonding pads 1 and the second bonding pads 3 are connected via the connecting wires 2, and adjacent connecting wires among the connecting wires 2 have different maximum stretchable heights in a direction perpendicular to the base substrate 4. The circuit board assembly 6 provides electrical signals to the sub-pixels via the connecting wires 2.

Figure 3:
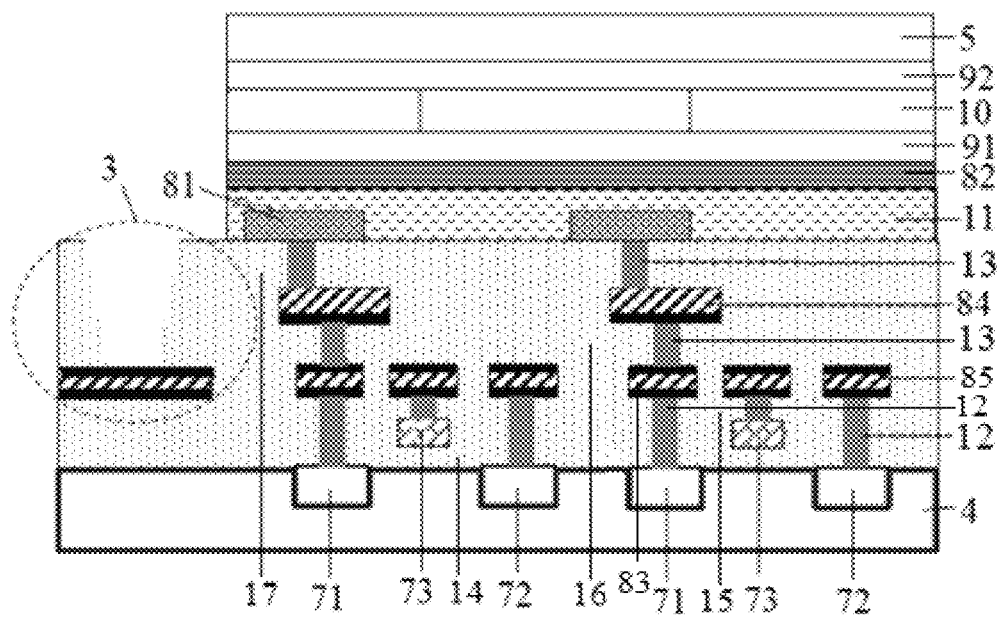
FIG. 3 is a schematic partial cross-sectional view taken along I-I in FIG. 2.

In the exemplary embodiment, the display panel may be the silicon-based OLED display panel, which has advantages such as small size and high resolution, and is widely applied to near-eye display devices such as a virtual reality (VR) display device and an augmented reality (AR) display device. Referring to FIG. 3, the display panel may include the base substrate 4, a pixel driving circuit, the light emitting element, a first encapsulation layer module 91, a color film layer 10, a second encapsulation layer module 92, and a cover plate 5.

The base substrate 4 includes the display area 42 and the non-display area 41 surrounding the display area 42. The plurality of second bonding pads 3 are disposed in the non-display area 41 of the base substrate 4. The plurality of sub-pixels are disposed in the display area 42. At least one of the sub-pixels includes: the source 71 and the drain 72 disposed on the base substrate 4; a first insulating layer 14 disposed on a side of the source 71 and the drain 72 facing away from the base substrate and the gate 73 disposed on a side of the first insulating layer facing away from the base substrate. The source 71, the drain 72 and the gate 73 form the driving transistor. The gate 73 is coupled to the storage capacitor (not shown in the figure). A second insulating layer 15 is disposed on a side of the gate 73 facing away from the base substrate 4, and a conductor layer is disposed on a side of the second insulating layer 15 facing away from the base substrate. The conductor layer may include the third electrode 83, a fifth electrode 85, and a sixth electrode. The second bonding pads 3 and the conductor layer are formed by a same patterning process. The third electrode 83 is coupled to the source 71 through a via connection portion 12 in the insulating layer, the drain 72 is coupled to the fifth electrode 85 through the via connection portion 12 in the insulating layer, and the gate 73 is coupled to the sixth electrode. In addition, the source 71 and the drain 72 can be interchanged. A third insulating layer 16 is disposed on a side of the third electrode 83 facing away from the base substrate 4, and a fourth electrode 84 is disposed on a side of the third insulating layer 16 facing away from the base substrate 4. The fourth electrode 84 is connected to the third electrode 83 connected to the source 71 through a tungsten via connection portion 13. A fourth insulating layer 17 is disposed on a side of the fourth electrode 84 facing away from the base substrate 4, and the light emitting element is disposed on a side of the fourth insulating layer 17 facing away from the base substrate.

The light-emitting element includes the first electrode 81, the light-emitting functional layer 11, and the second electrode 82 stacked in sequence, and the first electrode 81 is closer to the base substrate 4 than the second electrode 82. The first electrode 81 is coupled to the third electrode 83 via the fourth electrode 84.

The first encapsulation layer module 91 is disposed on a side of the light-emitting element facing away from the base substrate 4, and the color film layer 10 is disposed on a side of the first encapsulation layer module 91 facing away from the base substrate 4. The second encapsulation layer module 92 is disposed on a side of the color film layer 10 facing away from the base substrate 4, and the cover plate 5 is disposed on a side of the second encapsulation layer module 92 facing away from the base substrate 4.

Materials of the third electrode 83 and the fourth electrode 84 may include an aluminum layer and a protective layer disposed on one or both sides of the aluminum layer. A material of the protective layer may be TiN or Ti. The third electrode may function as a reflective layer. The gate is a poly-silicon gate grown by a molecular beam epitaxy process, and is conductive.

The first electrode 81 is an anode. The material of the first electrode 81 can be a transparent conductive material such as ITO (Indium Tin Oxide), IZO (Indium Zinc Oxide), IGO (Indium Gallium Oxide). The material of the first electrode can also be Ti/Al/Ti/Mo or Ti/Ag/ITO. The second electrode 82 is a cathode, and the material of the second electrode 82 may also be a transparent conductive material such as ITO (Indium Tin Oxide), IZO (Indium Zinc Oxide), IGO (Indium Gallium Oxide), etc.

Specifically, the light-emitting functional layer 11 may include a hole injection layer, a hole transport layer, an organic light emitting layer, an electron transport layer, and an electron injection layer. The hole injection layer is disposed on a side of the first electrode 81 facing away from the base substrate 4, the hole transport layer is disposed on a side of the hole injection layer facing away from the base substrate 4; the organic light emitting layer is disposed on a side of the hole transport layer facing away from the base substrate 4; the electron transport layer is disposed on a side of the organic light emitting layer facing away from base substrate 4; the electron injection layer is disposed on a side of the electron transport layer facing away from the base substrate 4.

A specific manufacturing process of the silicon-based OLED display substrate is as follows: providing the base substrate with a wafer; forming the driving circuit, the first electrode 81, the hole injection layer, the hole transport layer, the organic light emitting layer, the electron transport layer, and the electron injection layer, the second electrode 82, the first encapsulation layer module 91, the color film layer 10 and the second encapsulation layer module 92 in the sequence on the wafer; then attaching the cover plate 5 and performing cutting to form a plurality of silicon-based OLED display substrates.

In an embodiment, an edge of the circuit board assembly 6, an edge of the base substrate 4 and an edge of the display area 42 are all parallel to each other.

In the exemplary embodiment, the circuit board assembly 6 includes a printed circuit board and various components disposed on the printed circuit board. The circuit board assembly 6 can be formed by PCBA (Printed Circuit Board Assembly), that is, various components are assembled on the printed circuit board by the surface packaging process. In other words, the circuit board assembly 6 is formed as follows: the components are placed on an empty printed circuit board by SMT (Surface Mount Technology), and are mounted by DIP (dual inline-pin package).

In the exemplary embodiment, the plurality of first bonding pads 1 are disposed on the circuit board assembly 6. The plurality of first bonding pads 1 are disposed in a golden finger structure, and many rectangular metal contacts are arranged in rows on the printed circuit board near the edge. A NiAu layer is electroplated on a copper surface of the printed circuit board to form the metal contacts. These metal contacts are part of the printed circuit board, and the surface thereof is electroplated with the NiAu and the shape thereof is like fingers, so they are called as golden fingers. The golden fingers are used for connecting printed circuit boards, and can connect a circuit and transmit signals.

Figure 2:
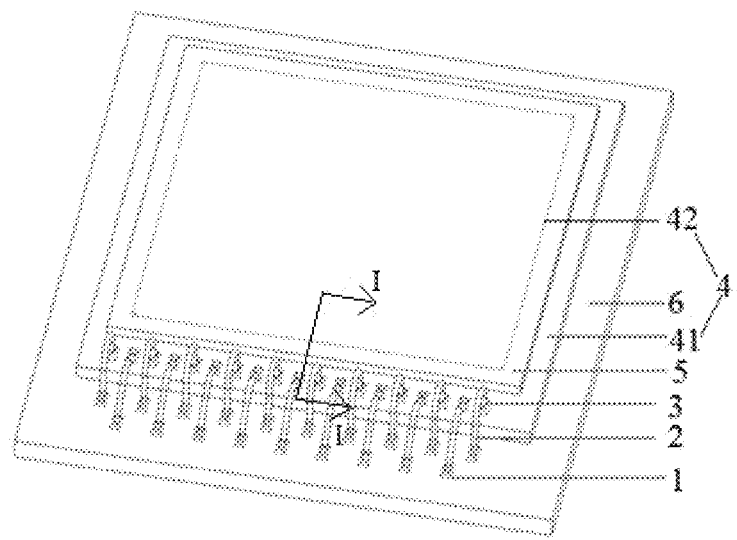
FIG. 2 is a schematic structural diagram of an exemplary embodiment of a display panel of the present disclosure.

Further referring to FIG. 2, in the exemplary embodiment, two adjacent ones among the first bonding pads 1 are disposed in a staggered manner so that the first bonding pads 1 are arranged in two rows. That is, assuming that the first bonding pads 1 are marked with serial numbers "1, 2, 3, 4, 5, 6 . . . " one by one from left to right, the first bonding pads 1 with the odd numbers are called as first odd-numbered row bonding pads, and the first bonding pads 1 with the even numbers are called as first even-numbered row bonding pads. The first bonding pads 1 with the odd numbers are arranged in a row which is in parallel with the edge of the base substrate 4. The first bonding pads 1 with the even numbers are arranged in another row which is in parallel with the edge of the base substrate 4. A distance between the first bonding pads 1 with the odd numbers and the edge of the base substrate 4 is smaller than a distance between the first bonding pads 1 with the even numbers and the edge of the base substrate 4, that is, the first bonding pads 1 with the even numbers are moved towards a direction away from the base substrate 4 by about 1 mm to 2 mm, for example, 1.5 mm. Therefore, the first odd-numbered row bonding pads are closer to the edge of the display area 42 than the first even-numbered row bonding pads.

An arrangement structure of the plurality of first bonding pads 1 is not limited to the above description. For example, the distance between the first bonding pads 1 with the odd numbers and the edge of the base substrate 4 may be larger than the distance between the first bonding pads 1 with the even numbers and the edge of the base substrate 4, so that the first even-numbered row bonding pads are closer to the edge of the display area 42 than the first odd-numbered row bonding pads. Alternatively, the first bonding pads 1 can also be arranged in three rows, four rows or more rows. Optionally, the first bonding pads 1 can also be disposed in a jagged form, as long as two adjacent first bonding pads 1 are disposed in the staggered manner.

In the exemplary embodiment, the second bonding pads 3 may be disposed in a row.

Further referring to FIG. 2 where the first bonding pads 1 are disposed in two rows in the staggered manner and the connecting wires 2 have the same length, after a first end of each connecting wire being connected to a first bonding pad 1 and a second end of each connecting wire 2 being connected to a second bonding pad 3, two adjacent connecting wires 2 are made to have different maximum stretchable heights in a direction perpendicular to the base substrate, so that the connecting wires 2 form arch shapes with different arch heights after being naturally bent. The arch heights of the connecting wires 2 connected to the first bonding pads 1 with odd numbers are higher, and the arch heights of the connecting wires 2 connected to the first bonding pads 1 with even numbers are lower, so that a distance between two adjacent connecting wires 2 is increased. In this way, no wire bonding short will occur even under the action of the lateral force of the flowing filler glue. This is because that the connecting wires 2 with lower arch heights are not easy to be inclined, and in a case where the connecting wires 2 with higher arch heights are inclined, two adjacent connecting wires 2 are not easy to be overlapped together due to an increase in the distance between two adjacent connecting wires 2. Therefore, the yield of the silicon-based OLED display device increases.

Figure 4:
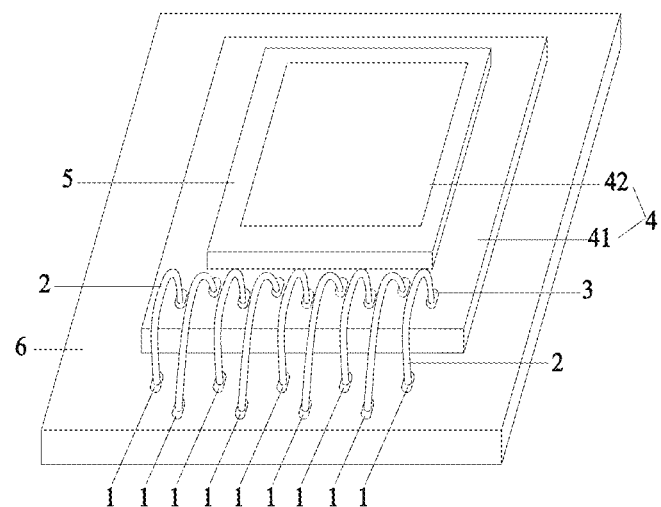
FIG. 4 is a schematic structural diagram of another exemplary embodiment of a display panel of the present disclosure.

The arrangement of the second bonding pads 3 is not limited to the above description. FIG. 4 is a schematic structural diagram of further another exemplary embodiment of a display panel of the present disclosure, and as shown in FIG. 4, the second bonding pads 3 with odd numbers are called as second odd-numbered row bonding pads, and the second bonding pads 3 with even numbers are called as second even-numbered row bonding pads. The second bonding pads 3 can also be arranged in the manner of the first bonding pad 1, that is, the second bonding pads 3 with odd numbers are disposed in a row which is in parallel with the edge of the base substrate 4; the second bonding pads 3 with even numbers are disposed in another row which is in parallel with the edge of the base substrate 4. A distance between the second bonding pads 3 with the odd numbers and the edge of the base substrate 4 is smaller than a distance between the second bonding pads 3 with the even numbers and the edge of the base substrate 4, that is, the second bonding pads 3 with the even numbers are moved away from the edge of the base substrate 4 (that is, towards the center of the display area 42) by about 1 mm to 2 mm, for example, 1.5 mm. The second odd-numbered row bonding pads are farther away from the edge of the display area 42 than the second even-numbered row bonding pads.

Besides that the first bonding pads 1 are staggered in two rows (that is, the first odd-numbered row bonding pads are closer to the edge of the display area 42 than the first even-numbered row bonding pads) and the connecting wires 2 have the same length, after the first end of the connecting wire 2 being connected to the first bonding pad and the second end of the connecting wire 2 being connected to the second bonding pad 3, a difference in the arch heights of two adjacent connecting wires 2 bent into the arch shapes is made larger. That is, the arch height of the connecting wire 2 connected to the odd-numbered first bonding pad 1 is higher, and the arch height of the connecting wire 2 connected to the even-numbered first bonding pad 1 is lower, so that a distance between two adjacent connecting wires 2 is increased. In this way, no wire bonding short will occur even under the action of the lateral force of the flowing filler glue. This is because that the connecting wires 2 with lower arch heights are not easy to be inclined, and even if the connecting wires 2 with higher arch heights are inclined, they are not easy to be overlapped together due to the increasing distance between them. Therefore, the yield of the silicon-based OLED display device increases.

Figure 5:
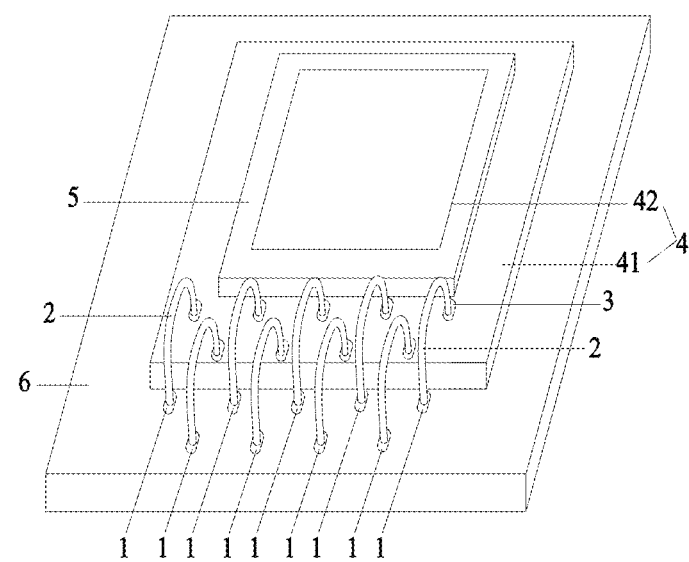
FIG. 5 is a schematic structural diagram of still another exemplary embodiment of a display panel of the present disclosure.

The above described an embodiment where the even-numbered first bonding pad 1 moves away from the base substrate 4 (away from the display area 42), and the even-numbered second bonding pad 3 moves away from the edge of the base substrate 4 (close to the display area 42). FIG. 5 is a schematic structural diagram of still another exemplary embodiment of a display panel of the present disclosure. It is also possible that the even-numbered first bonding pad 1 moves away from the base substrate 4 (away from the display area 42), and the even-numbered second bonding pad 3 moves towards the edge of the base substrate 4 (away from the display area 42), and the amount of movement of the even-numbered first bonding pad 1 and the even-numbered second bonding pad 3 are the same. In this case, if the lengths of the connecting wires 2 are the same, after the first end of the connecting wire 2 being connected to the first bonding pad 1 and the second end of the connecting wire 2 being connected to the second bonding pad 3, two adjacent connecting wires 2 are bent into arch shapes so that the heights of the arches are the same and the two adjacent connecting wires 2 are staggered. In this way, a distance between highest points of the two adjacent connecting wires 2 may also increase. As a result, no wire bonding short will occur even if the connecting wire 2 is inclined due to the lateral force of the flowing filler glue. This is because that, the connecting wire 2 has the largest swing amplitude at the highest point so that the distance between the highest points of the two adjacent connecting wires 2 is increased, thus the two adjacent connecting wires 2 are not easy to be overlapped together due to the increasing distance between two adjacent connecting wires 2. Therefore, the yield of the silicon-based OLED display device increases.

The arrangement structure of the second bonding pads 3 is not limited to the above description. For example, the distance between the odd-numbered second bonding pad 3 and the display area 42 may be greater than the distance between the even-numbered second bonding pad 3 and the display area 42, so that the second even-numbered row bonding pad is closer to the edge of the display area 42 than the second odd-numbered row bonding pads. The second bonding pads 3 can also be arranged in 3 rows, 4 rows or more rows. Further, the second bonding pads 3 can also be disposed in a jagged form, as long as two adjacent second bonding pads 3 are disposed in a staggered manner.

In addition, it can be understood that it may be possible that the even-numbered first bonding pad 1 may move towards the base substrate 4 (close to the display area 42), and the even-numbered second bonding pad 3 may move away from the edge of the base substrate 4 (close to the display area 42), and the amount of movement of the two bonding pads are the same.

The amount of movement of the first bonding pad 1 and the second bonding pad 3 may also be different. In this case, if the lengths of the connecting wires 2 are the same, after the first end of the connecting wire 2 being connected to the first bonding pad 1 and the second end of the connecting wire 2 being connected to the second bonding pad 3, two adjacent connecting wires 2 are bent into arch shapes the heights of which are different, and the two adjacent connecting wires 2 are also staggered, which can also achieve the above technical effects.

Also, it is understood that when the second bonding pads 3 are disposed in the staggered manner, the first bonding pads 1 can be not disposed in the staggered manner. That is, the first bonding pads can be arranged in one row, which is similar to the case where the first bonding pads 1 are disposed in the staggered manner and the second bonding pads 3 are not disposed in the staggered manner, and the beneficial effects are also similar.

In addition, in other exemplary embodiments of the present disclosure, the first bonding pads 1 and the second bonding pads 3 may both be disposed in one row, that is, the first bonding pads 1 and the second bonding pads 3 are disposed as shown in FIG. 1. In this case, the lengths of two adjacent connecting wires 2 can be different. For example, the length of an odd-numbered connecting wire 2 may be longer than the length of an even-numbered connecting wire 2. After the connecting wire 2 is connected to the first bonding pad 1 and the second bonding pad 3, two adjacent connecting wires 2 are also bent into arch shapes the arch heights of which are different, so that the distance between the two adjacent connecting wires 2 is larger. In this way, even if the connecting wire 2 is inclined due to the lateral force of the flowing filler glue, two adjacent connecting wires 2 are not easy to be overlapped together without leading to wire bonding short. Therefore, the yield of the silicon-based OLED display device increases.

In an embodiment, two adjacent first bonding pads 1 and two adjacent second bonding pads 3 are both disposed in the staggered manner. Alternatively, only one of the two adjacent first bonding pads 1 and the two adjacent second bonding pads 3 are disposed in the staggered manner, and the greater the distance between the first bonding pad 1 and the second bonding pad 3, the shorter the length of the corresponding connecting wire 2 connecting the first bonding pad 1 and the second bonding pad 3. The connecting wire 2 may substantially have no arch height as long as it can connect the first bonding pad 1 and the second bonding pad 3. As a result, it also makes it difficult for two adjacent connecting wires 2 to be overlapped together without leading to wire bonding short. Therefore, the yield of the product increases.

It should be noted that the above embodiment describes the case where the plurality of first bonding pads 1 and the plurality of second bonding pads 3 are arranged in two rows in the staggered manner, and the even rows and odd rows are defined for the convenience of explanation, and the staggered conditions of the even rows and odd rows are interchangeable, which is not described in detail here. In addition, there are many other manners for the staggered conditions of the plurality of first bonding pads 1 and the plurality of second bonding pads 3, as long as the plurality of first bonding pads 1 and the plurality of second bonding pads 3 are arranged in the staggered manner so that adjacent connecting wires 3 among the connecting wires 2 have different maximum stretchable heights in the direction perpendicular to the base substrate 4 or adjacent connecting wires 3 are arranged in the staggered manner. Further, the first bonding pads 1 and the second bonding pads 3 may be arranged in the staggered manner and the connecting wires 2 are set to have different lengths, so that adjacent connecting wires 3 among the connecting wires 2 have different maximum stretchable heights in the direction perpendicular to the base substrate 4 or adjacent connecting wires 3 are arranged in the staggered manner. The above situations all belong to the protection scope of the present disclosure.

In addition, it should be noted that the above exemplary implementation is applicable to all wire bonding. Since PPI (Pixels Per Inch) of a glass-based OLED is low, the glass-based OLED mostly uses ACF bonding. However, in a case where the LCD and the glass-based OLED adopt the wire bonding, the above exemplary implementation are also applicable to the LCD and the glass-based OLED.

Further, the present disclosure further provides a display device, which may include the above-mentioned display panel. A specific structure of the display panel has been described in detail above, so it will not be repeated here.

A specific type of the display device is not particularly limited, and the types of display devices commonly used in the art can all applicable, such as OLED displays, mobile devices such as mobile phones, wearable devices such as watches, VR devices, etc., which can be selected by those skilled in the art according to specific purpose of the display device accordingly, which will not be repeated here.

It should be noted that, in addition to the display panel, the display device further includes other necessary components. Taking the display as an example, the necessary components may be, for example, a housing, a circuit board, a power cord, etc. Those skilled in the art may make supplement according to specific usage requirements of the display device, and the detailed description is omitted here.

Compared with the prior art, beneficial effects of the display device provided by the embodiments of the present disclosure are the same as the beneficial effects of the display panel provided by the foregoing embodiments, and will not be repeated here.

Other embodiments of the present disclosure will be apparent to those skilled in the art after those skilled in the art consider the specification and practice the technical solutions disclosed herein. The present application is intended to cover any variations, uses, or adaptations of the present disclosure, which are in accordance with the general principles of the present disclosure and include common general knowledge or conventional technical means in the art that are not disclosed in the present disclosure. The specification and embodiments are illustrative, and the real scope and spirit of the present disclosure is defined by the appended claims.

What is claimed is:

1. A display panel, comprising:
a base substrate having a display area and a non-display area surrounding the display area;
a plurality of sub-pixels, located in the display area and disposed on a side of the base substrate, wherein at least one of the plurality of sub-pixels comprises a light-emitting element and a driving circuit; wherein the light-emitting element comprises a first electrode, a light-emitting functional layer and a second electrode stacked in sequence, and the first electrode is closer to the base substrate than the second electrode; wherein the driving circuit is disposed between the light-emitting element and the base substrate, and comprises a driving transistor, a storage capacitor and a third electrode, wherein the driving transistor comprises a source, a drain and a gate, one of the source and the drain is coupled to the third electrode, and the third electrode is coupled to the first electrode, and the gate is coupled to the storage capacitor;
a circuit board assembly, disposed on a side of the base substrate facing away from the light-emitting element, and comprising a plurality of first bonding pads;
a plurality of second bonding pads, located in the non-display area of the base substrate; and
a plurality of connecting wires, connecting the plurality of first bonding pads and the plurality of second bonding pads, wherein adjacent connecting wires among the plurality of connecting wires have different maximum stretchable heights in a direction perpendicular to the base substrate;
wherein the circuit board assembly is configured to provide electrical signals to the plurality of sub-pixels via the plurality of connecting wires.

2. The display panel according to claim 1, wherein the plurality of first bonding pads are connected to the plurality of second bonding pads in a one-to-one correspondence via two ends of the plurality of connecting wires.

3. The display panel according to claim 2, wherein at least one of the following are disposed in a staggered manner: the first bonding pads connected to two adjacent connecting wires among the plurality of connecting wires; or the second bonding pads connected to two adjacent connecting wires among the plurality of connecting wires.

4. The display panel according to claim 3, wherein the plurality of first bonding pads comprises a plurality of first odd-numbered row bonding pads and a plurality of first even-numbered row bonding pads, and the plurality of first odd-numbered row bonding pads are closer to an edge of the display area than the plurality of first even-numbered row bonding pads, or the plurality of first even-numbered row bonding pads are closer to the edge of the display area than the plurality of first odd-numbered row bonding pads.

5. The display panel according to claim 3, wherein the plurality of second bonding pads comprises a plurality of second odd-numbered row bonding pads and a plurality of second even-numbered row bonding pads, and the plurality of second odd-numbered row bonding pads are closer to an edge of the display area than the plurality of second even-numbered row bonding pads, or the plurality of second even-numbered row bonding pads are closer to the edge of the display area than the plurality of second odd-numbered row bonding pads.

6. The display panel according to claim 3, wherein wire lengths of the plurality of connecting wires are the same.

7. The display panel according to claim 3, wherein the greater a distance between the first bonding pad and the second bonding pad, the shorter a length of a corresponding connecting wire connecting the first bonding pad and the second bonding pad.

8. The display panel according to claim 3, wherein the first bonding pads and the second bonding pads connected to two adjacent connecting wires among the plurality of connecting wires are both disposed in a staggered manner.

9. The display panel according to claim 2, wherein the first bonding pads and the second bonding pads connected to two adjacent connecting wires among the plurality of connecting wires are both disposed in a staggered manner.

10. The display panel according to claim 9, wherein the plurality of first bonding pads comprises a plurality of first odd-numbered row bonding pads and a plurality of first even-numbered row bonding pads, and the plurality of second bonding pads comprises a plurality of second odd-numbered row bonding pads and a plurality of second even-numbered row bonding pads;
wherein the plurality of first odd-numbered row bonding pads are closer to the edge of the display area than the plurality of first even-numbered row bonding pads, and the plurality of second odd-numbered row bonding pads are closer to the edge of the display area than the plurality of second even-numbered row bonding pads; or
the plurality of first odd-numbered row bonding pads are farther away from the edge of the display area than the plurality of first even-numbered row bonding pads, and the plurality of second odd-numbered row bonding pads are farther away from the edge of the display area than the plurality of second even-numbered row bonding pads.

11. The display panel according to claim 9, wherein the plurality of first bonding pads comprises a plurality of first odd-numbered row bonding pads and a plurality of first even-numbered row bonding pads, and the plurality of second bonding pads comprises a plurality of second odd-numbered row bonding pads and a plurality of second even-numbered row bonding pads;
wherein the plurality of first odd-numbered row bonding pads are closer to the edge of the display area than the plurality of first even-numbered row bonding pads, and the plurality of second odd-numbered row bonding pads are farther away from the edge of the display area than the plurality of second even-numbered row bonding pads; or
the plurality of first odd-numbered row bonding pads are farther away from the edge of the display area than the plurality of first even-numbered row bonding pads, and the plurality of second odd-numbered row bonding pads are closer to the edge of the display area than the plurality of second even-numbered row bonding pads.

12. The display panel according to claim 9, wherein wire lengths of the plurality of connecting wires are the same.

13. The display panel according to claim 9, wherein the greater a distance between the first bonding pad and the second bonding pad, the shorter a length of a corresponding connecting wire connecting the first bonding pad and the second bonding pad.

14. The display panel according to claim 2, wherein the plurality of first bonding pads are arranged in three or four rows in a staggered manner, and/or the plurality of second bonding pads are arranged in three or four rows in a staggered manner.

15. The display panel according to claim 2, wherein the plurality of first bonding pads and the plurality of second bonding pads are respectively arranged in one row, and wire lengths of two adjacent connecting wires are different.

16. The display panel according to claim 1, wherein the plurality of first bonding pads have a golden finger structure.

17. The display panel according to claim 1, wherein the base substrate is a silicon substrate.

18. The display panel according to claim 1, wherein the light-emitting functional layer comprises:
   a hole injection layer, disposed on a side of the first electrode facing away from the base substrate;
   a hole transport layer, disposed on a side of the hole injection layer facing away from the base substrate;
   an organic light-emitting layer, disposed on a side of the hole transport layer facing away from the base substrate;
   an electron transport layer, disposed on a side of the organic light-emitting layer facing away from the base substrate; and
   an electron injection layer, disposed on a side of the electron transport layer facing away from the base substrate.

19. The display panel according to claim 1, wherein the first electrode is an anode and the second electrode is a cathode.

20. A display device having a display panel, the display panel comprising:
   a base substrate having a display area and a non-display area surrounding the display area;
   a plurality of sub-pixels located in the display area and disposed on a side of the base substrate, wherein at least one of the plurality of sub-pixels comprises a light-emitting element and a driving circuit, wherein the light-emitting element comprises a first electrode, a light-emitting functional layer and a second electrode stacked in sequence, and the first electrode is closer to the base substrate than the second electrode, wherein the driving circuit is disposed between the light-emitting element and the base substrate, and comprises a driving transistor, a storage capacitor and a third electrode, wherein the driving transistor comprises a source, a drain and a gate, one of the source and the drain is coupled to the third electrode, and the third electrode is coupled to the first electrode, and the gate is coupled to the storage capacitor;
   a circuit board assembly disposed on a side of the base substrate facing away from the light-emitting element, and comprising a plurality of first bonding pads;
   a plurality of second bonding pads located in the non-display area of the base substrate; and
   a plurality of connecting wires connecting the plurality of first bonding pads and the plurality of second bonding pads, wherein adjacent connecting wires among the plurality of connecting wires have different maximum stretchable heights in a direction perpendicular to the base substrate;
   wherein the circuit board assembly is configured to provide electrical signals to the plurality of sub-pixels via the plurality of connecting wires.

* * * * *